(12) United States Patent
Hsieh et al.

(10) Patent No.: US 9,722,115 B2
(45) Date of Patent: Aug. 1, 2017

(54) SOLAR CELL ENCAPSULATING MODULE AND METHOD FOR MANUFACTURING THE SAME

(71) Applicant: INDUSTRIAL TECHNOLOGY RESEARCH INSTITUTE, Hsinchu (TW)

(72) Inventors: Hsin-Hsin Hsieh, Taipei (TW); Jang-Hsing Hsieh, New Taipei (TW); Chi-Shiung Hsi, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 572 days.

(21) Appl. No.: 13/866,260

(22) Filed: Apr. 19, 2013

(65) Prior Publication Data
US 2014/0174505 A1 Jun. 26, 2014

(30) Foreign Application Priority Data

Dec. 26, 2012 (TW) .............................. 101150266 A

(51) Int. Cl.
*H01L 31/048* (2014.01)
*H01L 31/05* (2014.01)
(52) U.S. Cl.
CPC ........ *H01L 31/048* (2013.01); *H01L 31/0481* (2013.01); *H01L 31/0516* (2013.01); *Y02E 10/50* (2013.01)
(58) Field of Classification Search
CPC .......................... H01L 31/048; H01L 31/0516; H01L 31/0481
See application file for complete search history.

(56) References Cited

U.S. PATENT DOCUMENTS

| | | | |
|---|---|---|---|
| 4,173,496 A | 11/1979 | Chiang et al. | |
| 4,590,327 A * | 5/1986 | Nath ............... | H01L 31/022433 136/256 |
| 5,549,762 A | 8/1996 | Cantarini | |
| 5,951,786 A | 9/1999 | Gee et al. | |
| 5,972,732 A | 10/1999 | Gee et al. | |
| 6,294,725 B1 | 9/2001 | Hirschberg et al. | |
| 6,388,187 B1 | 5/2002 | Takeyama et al. | |
| 7,862,624 B2 | 1/2011 | Tran | |
| 2005/0022857 A1 | 2/2005 | Daroczi et al. | |

(Continued)

FOREIGN PATENT DOCUMENTS

| | | |
|---|---|---|
| TW | 200811883 A | 3/2008 |
| TW | 200816502 A | 4/2008 |

(Continued)

OTHER PUBLICATIONS

Intellectual Property Office, Ministry of Economic Affairs, R.O.C., "Office Action", Taiwan, Feb. 26, 2015.

(Continued)

*Primary Examiner* — Golam Mowla
(74) *Attorney, Agent, or Firm* — Locke Lord LLP; Tim Tingkang Xia, Esq.

(57) ABSTRACT

The disclosure provides a solar cell encapsulating module including a first substrate, a first encapsulating material layer, a metal particle layer, multiple solar cells, a routing layer, a second encapsulating material layer and a second substrate. The first substrate is formed from a light transmittance material. The first encapsulating material layer is formed on the first substrate. The metal particle layer is formed on the first encapsulating material layer. The solar cells are disposed on the metal particle layer. The routing layer is disposed on the solar cells for being electrically connected to the plurality of solar cells. The second encapsulating material layer is formed on the routing layer. The second substrate is disposed on the second encapsulating material layer. The routing layer is disposed on only one side of the solar cells.

13 Claims, 6 Drawing Sheets

(56) References Cited

U.S. PATENT DOCUMENTS

| | | | |
|---|---|---|---|
| 2007/0095384 A1 | 5/2007 | Farquhar et al. | |
| 2007/0235077 A1* | 10/2007 | Nagata | B32B 17/10018 136/256 |
| 2008/0216887 A1 | 9/2008 | Hacke et al. | |
| 2010/0096002 A1* | 4/2010 | Hayashi | H01B 1/22 136/252 |
| 2011/0017268 A1 | 1/2011 | Shembel et al. | |
| 2011/0186119 A1 | 8/2011 | Atwater et al. | |
| 2012/0006483 A1 | 1/2012 | Hanoka et al. | |
| 2012/0048355 A1 | 3/2012 | Hsieh et al. | |

FOREIGN PATENT DOCUMENTS

| | | |
|---|---|---|
| TW | 200935616 A | 8/2009 |
| TW | 201128657 A | 8/2011 |
| WO | 2009099418 A2 | 8/2009 |

OTHER PUBLICATIONS

E. Moulin et al., Improved light absorption in thin-film silicon solar cells by integration of silver nanoparticles, Journal of Non-Crystalline Solids, 2008, p. 2488-2491, vol. 354.

D. M. Schaadt et al., Enhanced semiconductor optical absorption via surface plasmon excitation in metal nanoparticles, Applied Physics Letters, 2005, 063106-1, vol. 86.

Ulrich W. Paetzold et al., Design of nanostructured plasmonic back contacts for thin-film silicon solar cells, Optics Express, A1219-A1230, 2011, vol. 19, No. S6.

Vivian E. Ferry et al., Light trapping in ultrathin plasmonic solar cells, Optics Express, A237-A245, 2010, vol. 18, No. 102.

Anthony J. Morfa et al., Plasmon-enhanced solar energy conversion in organic bulk heterojunction photovoltaics, Applied Physics Letters, 2008, 013504, vol. 92.

Harry A. Atwater et al., Plasmonics for improved photovoltaic devices, Nature Materials, 2010, p. 205-213, vol. 9.

Hidenori Mizuno et al., Light Trapping by Ag Nanoparticles Chemically Assembled inside Thin-Film Hydrogenated Microcrystalline Si Solar Cells, Japanese Journal of Applied Physics, 2012, 042302, vol. 51.

Jonathan Govaerts et al., A Novel Concept for Advanced Modules with Back-Contact Solar Cells, 5th World Conference on Photovoltaic Energy Conversion, 2010, Valencia, Spain.

Chih-Hung Chen et al., Residual Stress and Bow Analysis for Silicon Solar Cell Induced by Soldering, International Conference on Optics and Photonics in Taiwan, 2008, Taipei, Taiwan.

M. Späth et al., First Experiments on Module Assembly Line using Back-Contact Solar Cells, Presented at the 23rd European Photovoltaic Solar Energy Conference, 2008, Valencia, Spain.

* cited by examiner

SOLAR CELL ENCAPSULATING MODULE AND METHOD FOR MANUFACTURING THE SAME

CROSS-REFERENCE TO RELATED APPLICATIONS

This non-provisional application claims priority under 35 U.S.C. §119(a) on Patent Application No(s). 101150266 filed in Taiwan, R.O.C. on Dec. 26, 2012, the entire contents of which are hereby incorporated by reference.

TECHNICAL FIELD

The disclosure relates to a solar cell encapsulating module.

BACKGROUND

Because of global climatic changes, air pollution and the gradual shortage of resources, solar power for using as a source of energy supply has attracted our attention, which leads to the rapid growth of solar cell market in the recent years.

A common and conventional solar cell has a P-N junction formed adjacent to its front surface or its light receiving surface. When the solar cell absorbs solar energy, the P-N junction generates electrons/electron-holes for outputting an electric current to the solar cell. A conventional design of the solar cell has an N-pole electrode disposed on a front side (light receiving side) of the solar cell, and a P-pole electrode disposed on a back side (non light receiving side) of the solar cell.

Another design of the solar cell is to have both the N-pole electrode and the P-pole electrode disposed on the back side of the solar cell. It is commonly called a back contact solar cell. The back contact solar cell can have both the solar cell and a solar cell circuit encapsulated in a single manufacturing process.

The technology for encapsulating a back contact solar cell is high electric generation and low encapsulating loss, and the output electric current can be enhanced by disposing both the electrodes on the back side. However, the problem of stress in tandem connection should be considered. Furthermore, the manufacturing processes of module may increase the risks of ineffective tandem connection and cell fragmentation. Also, ways to enhance the photoelectric conversion efficiency should be taken into consideration. Therefore, related researches on the issues are highly demanded.

SUMMARY

An embodiment of the disclosure provides a solar cell encapsulating module, comprising a first substrate, a first encapsulating material layer, a metal particle layer, a plurality of solar cells, a routing layer, a second encapsulating material layer and a second substrate. The first substrate is formed from a light transmittance material. The first encapsulating material layer is formed on the first substrate. The metal particle layer is formed on the first encapsulating material layer. The plurality of solar cells are disposed on the metal particle layer. The routing layer is disposed on the plurality of solar cells for being electrically connected to the plurality of solar cells. The second encapsulating material layer is formed on the routing layer. The second substrate is disposed on the second encapsulating material layer. The routing layer is disposed on only one side of the plurality of solar cells.

Another embodiment of the disclosure provides a method for manufacturing a solar cell encapsulating module comprising the following steps. A metal particle layer is formed on a first encapsulating material layer. A first substrate, formed from a light transmittance material, is provided. The first encapsulating material layer with the metal particle layer is placed on the first substrate. A plurality of solar cells are disposed on the metal particle layer. The plurality of solar cells, the metal particle layer, the first encapsulating material layer and the first substrate are all procured. A routing layer is formed on the plurality of solar cells. A second encapsulating material layer is formed on a second substrate. The second substrate with the second encapsulating material layer is disposed and laminated on the routing layer. The routing layer is covered by the second encapsulating material layer. The routing layer is disposed on only one side of the plurality of solar cells.

Yet another embodiment of the disclosure provides a method for manufacturing a solar cell encapsulating module comprising the following steps. A metal particle layer is formed on a first encapsulating material layer. A first substrate, formed from a light transmittance material, is provided. The first encapsulating material layer with the metal particle layer is placed on the first substrate. A plurality of solar cells are disposed on the metal particle layer. The plurality of solar cells, the metal particle layer, the first encapsulating material layer and the first substrate are all procured. A second encapsulating material layer is formed on a second substrate. A routing layer is formed on the second encapsulating material layer. The second substrate which has the second encapsulating material layer and the routing layer is disposed and laminated onto the plurality of solar cells. The routing layer is in direct contact with the plurality of solar cells. The routing layer is disposed on only one side of the plurality of solar cells.

Still another embodiment of the disclosure provides a method for manufacturing a solar cell encapsulating module comprising the following steps. A metal particle layer is formed on a first encapsulating material layer. A first substrate, formed from a light transmittance material, is provided. The first encapsulating material layer with the metal particle layer is placed on the first substrate. A plurality of solar cells are disposed on the metal particle layer. The plurality of solar cells, the metal particle layer, the first encapsulating material layer and the first substrate are all precured. A routing layer is formed on the plurality of solar cells. A second encapsulating material layer is formed on the routing layer. A second substrate is disposed and laminated onto the second encapsulating material layer. The routing layer is disposed on only one side of the plurality of solar cells.

BRIEF DESCRIPTION OF THE DRAWINGS

The disclosure will become more fully understood from the detailed description given herein below for illustration only, and thus does not limit the disclosure, wherein.

DETAILED DESCRIPTION

Figure 1:
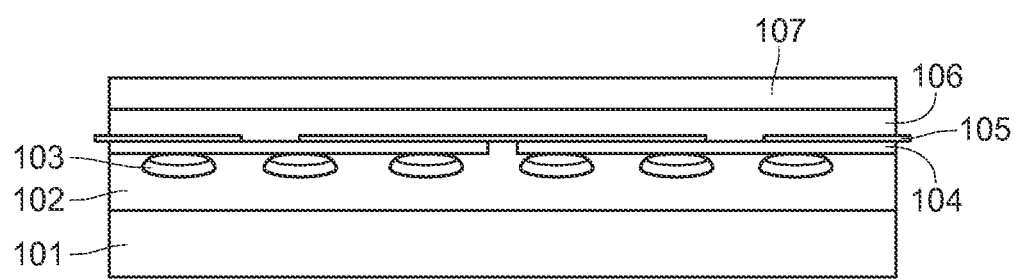
FIG. 1 is a view of a solar cell encapsulating module according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A solar cell encapsulating module and its manufacturing method are provided by embodiments of the disclosure. A metal particle layer is disposed in a solar cell encapsulating module for enhancing the photoelectric conversion efficiency. A precuring process (namely, pre-solidify process) is used in the manufacturing method of the solar cell for laminating and encapsulating the solar cell and other encapsulating components at the same time in order to reduce the risk of solar cell fragmentation.

Please refer to FIG. 1, which is a view of a solar cell encapsulating module according to one embodiment of the disclosure. The solar cell encapsulating module comprises a first substrate 101, a first encapsulating material layer 102, a metal particle layer 103, a plurality of solar cells 104, a routing layer 105, a second encapsulating material layer 106 and a second substrate 107.

As shown in the FIG. 1, the first substrate 101 is formed from a light transmittance material. The first encapsulating material layer 102 is formed on the first substrate 101. The metal particle layer 103 is formed on the first encapsulating material layer 102. The plurality of solar cells 104 are disposed on the metal particle layer 103. The routing layer 105 is disposed on the plurality of solar cells 104. The routing layer 105 is used for achieving electrical interconnection for the plurality of solar cells 104. The second encapsulating material layer 106 is formed on the routing layer 105. The second substrate 107 is disposed on the second encapsulating material layer 106. The plurality of solar cells 104 are back contact solar cells, so that the routing layer 105 is disposed on only one side of the plurality of solar cells 104. In other words, the routing layer 105 is not on both sides of the plurality of solar cells 104 but on the rear side of the plurality of solar cells 104.

As for the materials, the first substrate 101 is a light transmittance substrate, but does not limit the disclosure. For example, the first substrate 101 is made of glass. The second substrate 107 is a lightproof substrate, but does not limit the disclosure. For example, the second substrate 107 is made of polyester, polyolefin, polyethylene, polypropylene or polyimide. In an embodiment, the first encapsulating material layer 102 and the second encapsulating material layer 106 are made of ethylene-vinyl acetate copolymer (EVA), polyvinyl butyral (PVB), or silicone. In another embodiment, the thickness of the first substrate 101 is substantially between 50 micrometers (μm) and 3.5 millimeters (mm). The thickness of the second substrate 107 is substantially between 130 μm and 600 μm. The thickness of the first encapsulating material layer 102 is substantially between 50 μm and 1 mm. The thickness of the second encapsulating material layer 106 is substantially between 50 μm and 1 mm.

The metal particle layer 103 is composed of a plurality of metallic particles. The metal particle layer 103 continuously (namely, totally) covers the entire area of the plurality of solar cells 104. The thickness of the metal particle layer 103 should be specifically considered in order to allow light to penetrate through. Because the thickness of the metal particle layer 103 correlates with the diameters of the metallic particles, the particle diameter of the metal particle layer 103 in this embodiment is between 20 nm and 150 nm. In an embodiment, the metal particle s layer 103 is composed of gold particles. In another embodiment, the metal particle layer 103 is composed of silver particles. In yet another embodiment, the metal particle layer 103 is composed of copper particles. In an embodiment, the thickness of the metal particle layer 103 is approximately between 20 nm and 150 nm.

In an embodiment, a coverage percentage of a light receiving surface of the plurality of solar cells 104 covered by the metal particle layer 103 is between 20% and 30%. In other words, the metal particle layer 103 covers substantially 20% to 30% of the light receiving surface of the plurality of solar cells 104.

The disposition of the metal particle layer 103 may enhance the photoelectric conversion efficiency of the solar cell encapsulating module and prevent the efficiency of the solar cell encapsulating module from reducing. In one embodiment, when the metal particle layer 103 is made from the silver particles, the photoelectric efficiency of the components may be enhanced and the photocurrent may be increased by the resonance of surface plasmons because the silver particles have resonance and light focusing effects.

Figure 2:
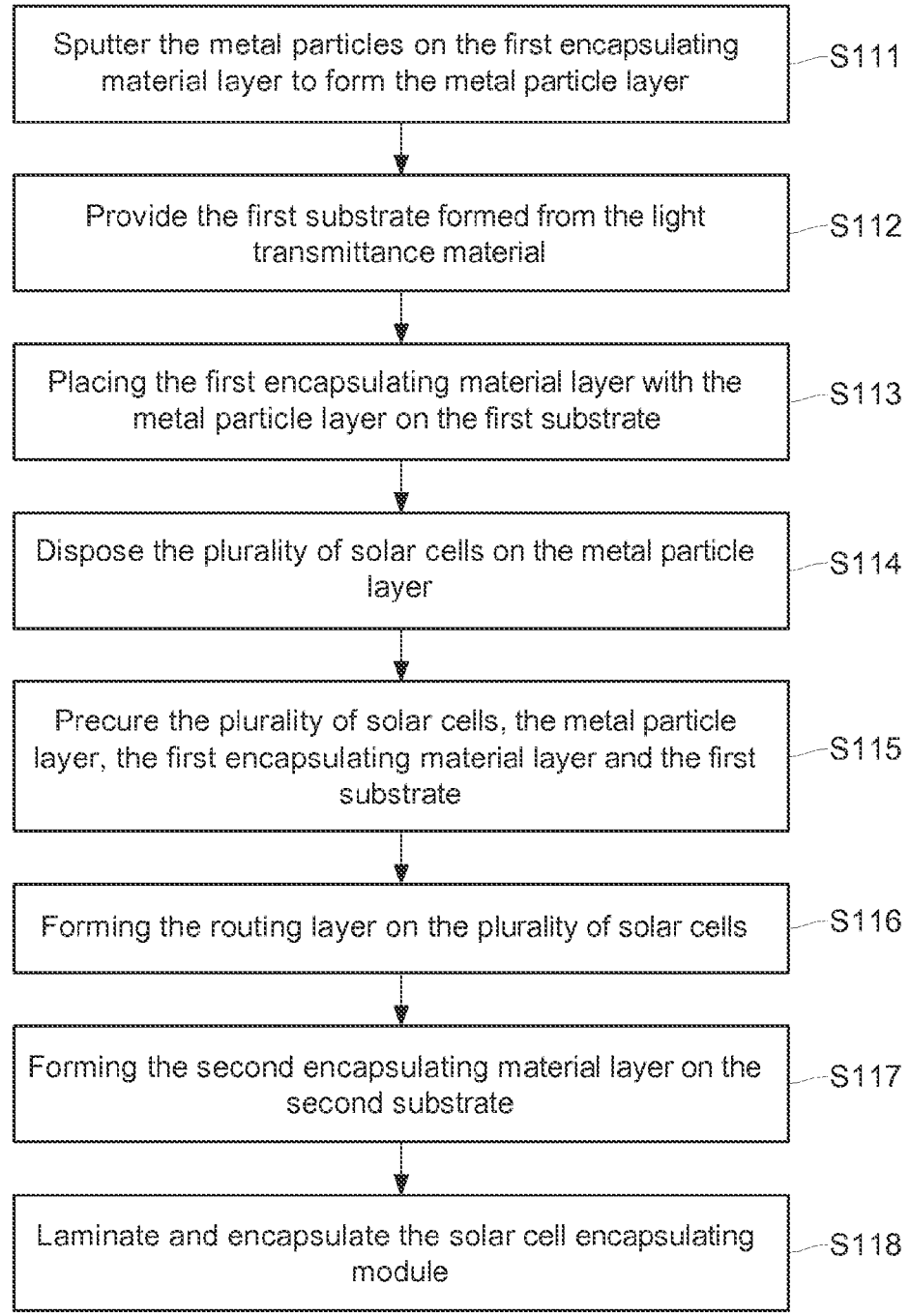
FIG. 2 is a flow chart of a method for manufacturing a solar cell according to an embodiment of the disclosure.

Please refer to FIG. 2, which is a flow chart of a method for manufacturing a solar cell according to an embodiment of the disclosure. The method for manufacturing a solar cell disclosed in this embodiment comprises the following steps. The plurality of solar cells, the first and second encapsulating material layers and the first and second substrates are precured first before the routing layer and the other encapsulating components are added. Then, the encapsulating and lamination processes are performed. The compositions, operations or materials of the elements or components in the previous embodiment are the same as or similar to those of the same elements or components in this embodiment, which will not be described herein again. Processes of manufacturing are described in detail hereinafter.

First, vapor deposition, for example, is used for sputtering the metallic particles on the first encapsulating material layer 102 so as to form the metal particle s layer 103 (step S111). Then, the first substrate 101, formed from a light transmittance material, is provided (step S112). Then, the first encapsulating material layer 102 with the metal particle layer 103 is placed on the first substrate 101 (step S113), and the plurality of solar cells 104 are disposed on the metal particle layer 103 (step S114). The metal particle layer 103 is formed on the light receiving surface of the plurality of solar cells 104 with a coverage percentage between 20% and 30%. Therefore, a first semi-finished product is obtained. The first semi-finished product with the plurality of solar cells 104, the metal particle layer 103, the first encapsulating material layer 102 and the first substrate 101 are all precured (step S115). The precuring process is mainly used for reducing the problems of bowing (namely, warping) and solar cell fragmentation.

Then, after the precuring process, the routing layer 105 is formed on the plurality of solar cells 104 (step S116) for achieving electrical interconnection for the plurality of solar cells 104.

Next, a second semi-finished product is formed. In this step, the second encapsulating material layer 106 is formed on the second substrate 107 (step S117).

Last, the first semi-finished product is placed on the second semi-finished product to cause the second encapsulating material layer 106 to cover the routing layer 105, and the solar cell encapsulating module is laminated and encapsulated (step S118).

The above description does not imply that there is a specific sequence for obtaining the first semi-finished product and the second semi-finished product. In an embodiment, the second semi-finished product is formed before forming the first semi-finished product, and then the first semi-finished product and the second semi-finished product are laminated.

Figure 3:
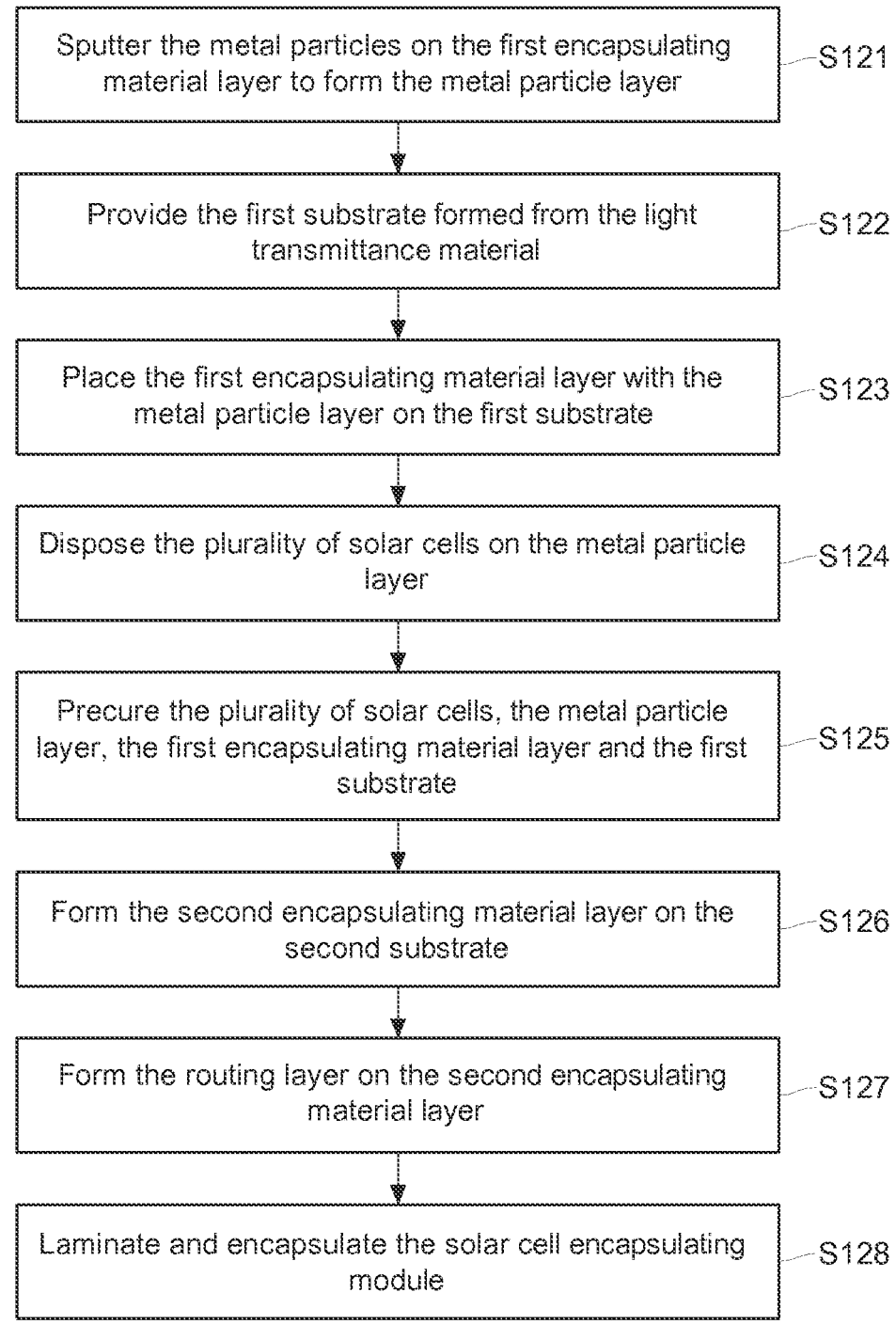
FIG. 3 is a flow chart of a method for manufacturing a solar cell according to another embodiment of the disclosure.

Please refer to FIG. 3, which is a flow chart of a method for manufacturing a solar cell according to another embodiment of the disclosure.

Firstly, vapor deposition, for example, is used for sputtering the metallic particles on the first encapsulating material layer 102 to form the metal particle layer 103 (step S121). Then, the first substrate 101, formed from a light transmittance material, is provided (step S122). Then, the first encapsulating material layer 102 with the metal particle layer 103 is placed on the first substrate 101 (step S123). The plurality of solar cells 104 are disposed on the metal particle layer 103 (step S124). The metal particle layer 103 is formed on the light receiving surface of the plurality of solar cells 104 with a coverage percentage between 20% and 30%. Therefore, a first semi-finished product is obtained. Then, the first semi-finished product with the plurality of solar cells 104, the metal particle layer 103, the first encapsulating material layer 102 and the first substrate 101 is precured (step S125). The precuring process is mainly used for reducing the problems of bowing (warping) and solar cell fragmentation.

Then, a second semi-finished product is formed. In this embodiment, the second encapsulating material layer 106 is formed on the second substrate 107 (step S126). Then, the routing layer 105 is formed on the second encapsulating material layer 106 (step S127). Last, the first semi-finished product is placed on the second semi-finished product, i.e., the second substrate 107 with the second encapsulating material layer 106 and the routing layer 105 is disposed on the plurality of solar cells 104, and the second substrate is laminated onto the plurality of solar cells 104 (step S128). Moreover, the routing layer 105 is in direct contact with the plurality of solar cells 104 for achieving electrical interconnection for the plurality of solar cells 104.

The above description does not imply that there is a specific sequence for achieving the first semi-finished product and the second semi-finished product. In an embodiment, the second semi-finished product may be formed before forming the first semi-finished product, and then the first semi-finished product and the second semi-finished product are laminated together.

Figure 4:
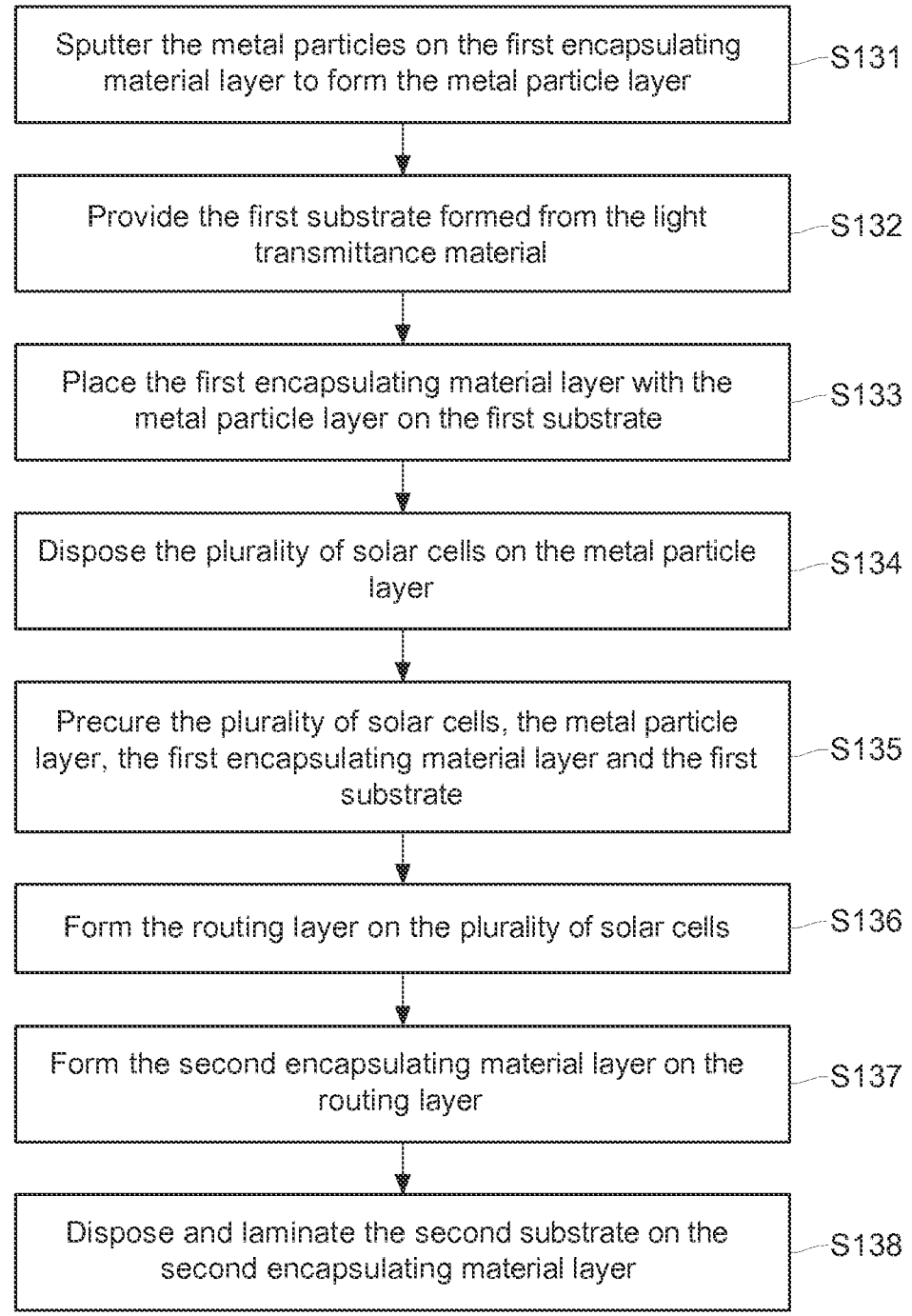
FIG. 4 is a flow chart of a method for manufacturing a solar cell according to yet another embodiment of the disclosure.

Please refer to FIG. 4, which is a flow chart of the solar cell manufacturing method according to another embodiment of the disclosure.

First, vapor deposition, for example, is used for sputtering the metallic particles on the first encapsulating material layer 102 to form the metal particle layer 103 (step S131). Then, the first substrate 101, formed from a light transmittance material, is provided (step S132). Then, the first encapsulating material layer 102 with the metal particle layer 103 is placed on the first substrate 101 (step S133). The plurality of solar cells 104 are disposed on the metal particle layer 103 (step S134). The metal particle layer 103 is formed on the light receiving surface of the plurality of solar cells 104 with a coverage percentage between 20% and 30%. Therefore, a first semi-finished product is obtained. The first semi-finished product with the plurality of solar cells 104, the metal particle layer 103, the first encapsulating material layer 102 and the first substrate 101 are all precured (step S135). Similar to the previous embodiments, the precuring process is mainly used for reducing the problems of bowing (warping) and solar cell fragmentation.

Then, after the precuring process, the routing layer 105 is formed on the plurality of solar cells 104 (step S136) for achieving electrical interconnection for the solar cells 104. Next, the other routing layer 105 is formed on the solar cells 104 (step S136). Then, the second encapsulating material layer 106 is formed on the routing layer 105 (step S137). Last, the second substrate 107 is disposed and laminated on the second encapsulating material layer 106 (step S138).

The above description does not imply that there is a specific sequence for obtaining the first semi-finished product and the second semi-finished product. In an embodiment, the second semi-finished product can be formed before forming the first semi-finished product, and then the first semi-finished product and the second semi-finished product are laminated together.

The solar cell fragmentation and module ineffectiveness occur easily in the module lamination process of the solar cell. In the solar cell encapsulating module disclosed in the embodiments, the plurality of solar cells 104, the metal particle layer 103, the first encapsulating material layer 102 and the first substrate 101 are precured beforehand. Then, the other components are further added. Last, the encapsulating and lamination processes are performed at the same time. The precuring process is mainly used for reducing the problems of bowing and solar cell fragmentation.

The solar cell manufacturing method disclosed in the embodiments is suitable for using in a back contact solar cell with coplanar electrodes, the precuring process is mainly used for reducing the risks of solar cell fragmentation and ineffectiveness in the module manufacturing process of back contact solar cell and enhancing the production yield rate.

The characteristics of the solar cell encapsulating module disclosed in the embodiments are described hereinafter.

Figure 5:
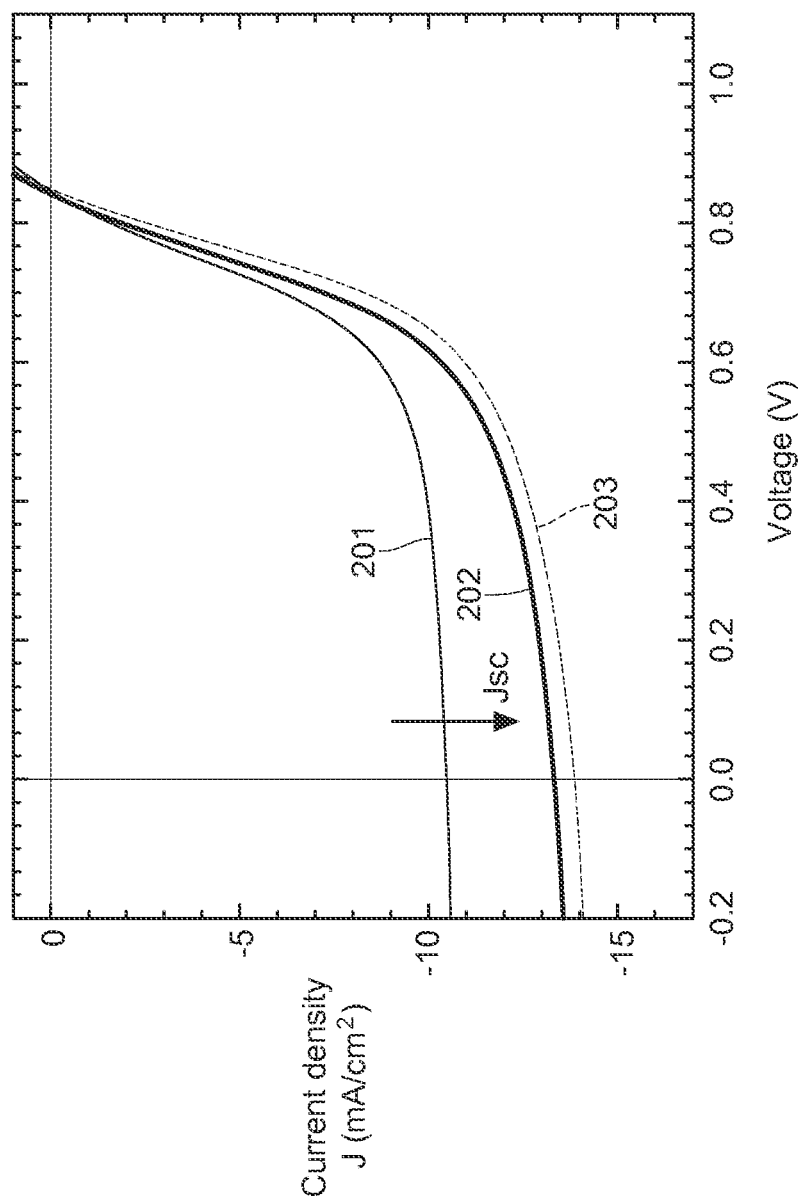
FIG. 5 is a graph of relationships of current density and voltage of a solar cell encapsulating module in an embodiment and a conventional back contact solar cell encapsulating module.

Please refer to FIG. 5, which is a graph of relationships of current density and voltage of a solar cell encapsulating module in an embodiment and a conventional back contact solar cell encapsulating module. A short circuit current density Jsc is an intersecting point of the curve and the X axis at zero.

A dimension of the solar cell encapsulating module in this embodiment is 5.0×5.0 square centimeters ($cm^2$), the silver particles are adopted for the metal particle layer 103, and the particle diameter is the same as described in the abovementioned embodiments. The conventional back contact solar cell encapsulating module does not comprise the metal particle layer, and its dimension is 5.0×5.0 $cm^2$. The conventional back contact solar cell encapsulating module does not comprise silver (Ag).

A short circuit current density Jsc of the conventional back contact solar cell encapsulating module is 10.5 milliamperes/$cm^2$ ($mA/cm^2$), as shown in a curve 201. A short circuit current density of a first sample of the solar cell encapsulating module in one embodiment of the disclosure is increased to 13.45 mA/cm² after annealing for 20 minutes at 250° C., as shown in a curve 202. A short circuit current density of a second sample of the solar cell encapsulating module in another embodiment of the disclosure is increased to 13.96 mA/cm² after annealing for 20 minutes at 350° C., as shown in a curve 203. As shown in FIG. 5, the short circuit current density is enhanced after adding the metal particles. The short circuit current density is also enhanced after annealing at higher temperature.

The comparisons of characteristics of the solar cell encapsulating module of the embodiments and those of the conventional back contact solar cell encapsulating module are described in a Table-1 listed below. The comparisons are series resistance (Rs), shunt resistance (Rsh) and fill factor (FF).

TABLE 1

|  | Thin film solar cell incorporated with silver | Embodiment of disclosure | Conventional back contact solar cell encapsulating module | Efficiency |
| --- | --- | --- | --- | --- |
| Rs (Ohm) | Increased | 0.082 | 0.068 | 20.59% |
| Rsh (Ohm) | Reduced | 18.401 | 11.855 | 55.22% |
| FF (%) | 54.8 | 77.659 | 75.735 | 1.92% |

The dimension of the solar cell encapsulating module of the embodiment is 5.0×5.0 cm². The dimension of the conventional back contact solar cell encapsulating module is 5.0×5.0 cm². The fill factor (FF) is defined as a ratio of a maximum output power (Pmax) and the product of an open circuit voltage (Voc) and a short circuit current (Isc) when the maximum electric power is outputted by the solar cell.

Figure 6:
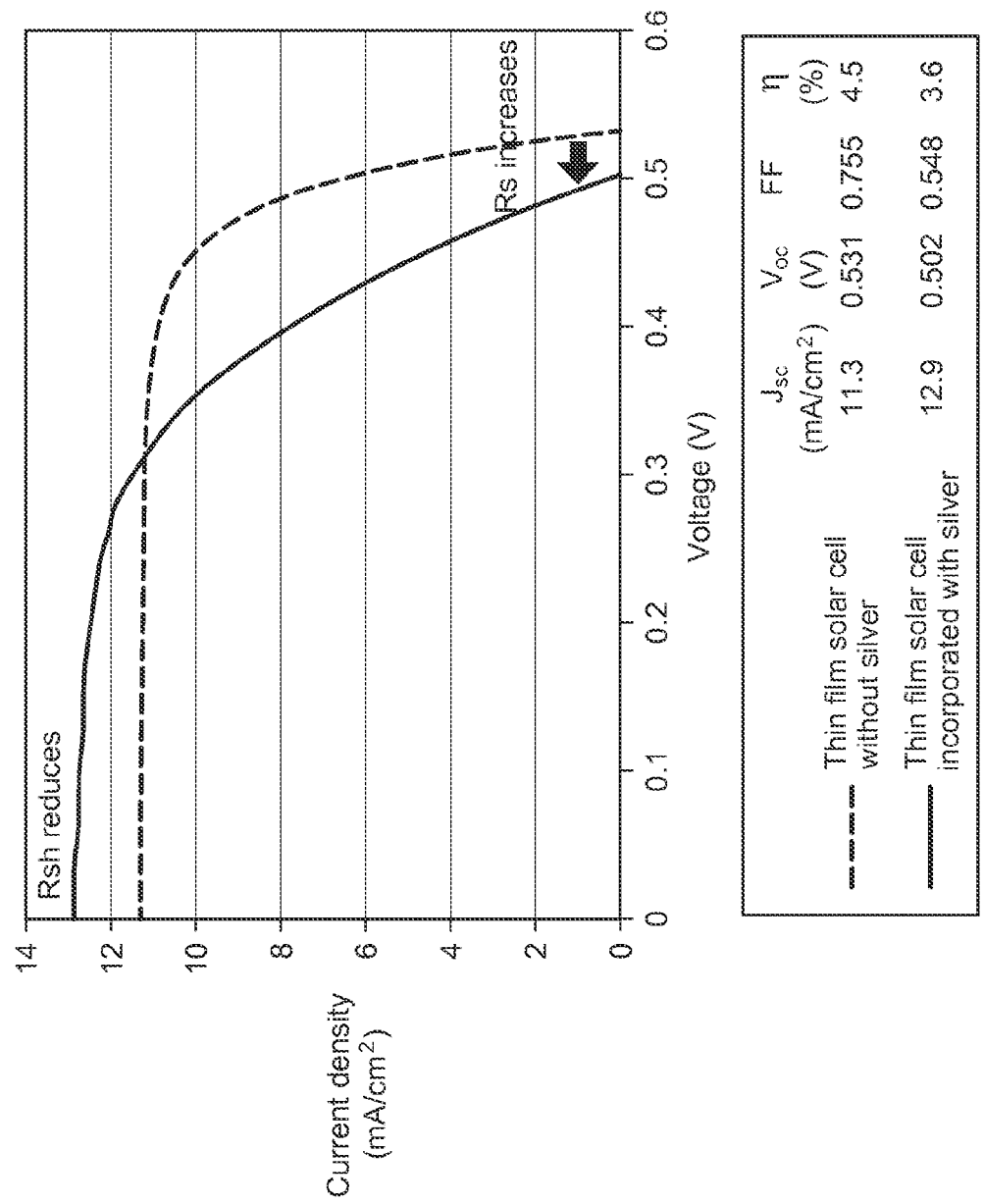
FIG. 6 is a graph of comparisons between a thin film solar cell with silver and a thin film solar cell without silver.

Data in FIG. 6 and the thin film solar cell incorporated with silver in Table-1 is excerpted from Light Trapping by Ag Nanoparticles Chemically Assembled inside Thin-Film Hydrogenated Microcrystalline Si Solar Cells, H. Mizuno, *JJAP* 51 (2012) 042302. FIG. 6 is a graph of comparisons between a thin film solar cell with silver and a thin film solar cell without silver. The dotted line in FIG. 6 indicates the thin film solar cell without silver, and the solid line in FIG. 6 indicates the thin film solar cell incorporated with silver. FIG. 6 shows that the shunt resistance (Rsh) is reduced, the series resistance (Rs) is increased and the fill factor (FF) is reduced from 75.5% to 54.8%, when the silver particle layer is further incorporated with (added to) the thin film solar cell. On the contrary, in the solar cell encapsulating module in the embodiment of the disclosure, the series resistance (Rs) is increased slightly, which is not beneficial for the efficiency of the solar cell. However, the shunt resistance (Rsh) and the fill factor (FF) are enhanced (increased).

When the solar cell encapsulating module of the embodiments is compared with the conventional thin film without the metal particle layer 103, even though the series resistance (Rs) is increased slightly (i.e., not beneficial for the efficiency), the shunt resistance (Rsh) and the fill factor (FF) are enhanced (increased) substantially. The shunt resistance (Rsh) is enhanced by 55% approximately, which causes the fill factor (FF) to be enhanced by 1.92%.

Experimental data of a coverage percentage of the light receiving surface of the solar cell covered by the metal particle layer 103 of the solar cell encapsulating module of the embodiments and a short circuit current density (Jsc, A/cm²) is listed in Table-2 below. The coverage percentage is approximately between 20% and 30% (including 20% and 30%).

TABLE 2

| No. | Annealing conditions | Coverage percentage (%) | Average size of particles (nm) | Short circuit current density (Jsc, A/cm²) |
| --- | --- | --- | --- | --- |
| 1 | Solar cell without silver and annealing | 0 | 0 | 0.0233 |
| 2 | Solar cell incorporated with silver and without annealing | 39.78 | 85 | 0.0192 |
| 3 | Solar cell incorporated with silver and anneal at 250° C. for 10 minutes | 29.57 | 61.5 | 0.0299 |
| 4 | Solar cell incorporated with silver and anneal at 250° C. for 20 minutes | 29.91 | 42.5 | 0.0288 |
| 5 | Solar cell incorporated with silver and anneal at 250° C. for 30 minutes | 31.29 | 22.5 | 0.0281 |
| 6 | Solar cell incorporated with silver and anneal at 350° C. for 20 minutes | 27.92 | 49.5 | 0.0336 |

Experimental solar cell samples are sputtered with a prepared silver thin film and an Indium Tin Oxide (ITO) transparent conductive thin film, and have undergone a rapid thermal annealing process at different temperatures for different periods of time. Then, the coverage percentage of the thin film, radius of the thin film particles and photocurrent characteristics are measured.

Comparing the first group of the back contact solar cell encapsulating module without silver and annealing process to the sixth group of the back contact solar cell encapsulating module with silver and annealing process at 350° C. for 20 minutes, the short circuit current density of the first group is enhanced by 44.21%. Comparing the second group of the back contact solar cell encapsulating module with silver and without annealing process to the sixth group of the back contact solar cell encapsulating module with silver and annealing at 350° C. for 20 minutes, the short circuit current density of the second group is enhanced by 75.0% after treated with appropriate annealing.

According to the solar cell encapsulating module and the method for manufacturing the solar cell encapsulating module of the disclosure, the solar cell encapsulating module is formed by precuring the solar cells, the encapsulating material layers and the substrates, then the routing layer and the other encapsulating components are added, and lastly the encapsulating and lamination processes are performed at the same time. The precuring process is mainly used for reducing the problems of bowing and solar cell fragmentation. The metal particle layer in the solar cell encapsulating module is used for enhancing the photoelectric conversion efficiency and preventing the efficiency of the solar cell encapsulating module from reducing. According to the solar cell encapsulating module and the method for manufacturing the same of the disclosure, the ineffectiveness of back contact solar cell in the module manufacturing process is reduced, and the production yield rate is enhanced.

What is claimed is:
1. A solar cell encapsulating module, comprising:
  a first substrate formed from a light transmittance material;
  a first encapsulating material layer formed on the first substrate;

a metal particle layer formed on the first encapsulating material layer;

a plurality of solar cells disposed on the metal particle layer;

a routing layer disposed on the plurality of solar cells for being electrically connected to the plurality of solar cells, wherein the routing layer is disposed on only one side of the plurality of solar cells;

a second encapsulating material layer formed on the routing layer; and a second substrate disposed on the second encapsulating material layer, wherein the routing layer is located only between the plurality of solar cells and the second encapsulating material layer.

2. The solar cell encapsulating module as claimed in claim 1, wherein the metal particle layer is composed of a plurality of metal particles, a particle diameter of the metal particles is between 20 nanometers (nm) and 150 nm.

3. The solar cell encapsulating module as claimed in claim 2, wherein the metal particles are selected from a group consisting of gold, silver and copper.

4. The solar cell encapsulating module as claimed in claim 1, wherein a coverage percentage of a light receiving surface of the solar cells covered by the metal particle layer is between 20% and 30%.

5. A method for manufacturing a solar cell encapsulating module as claimed in claim 1, comprising steps of:

forming the metal particle layer on the first encapsulating material layer;

providing the first substrate formed from the light transmittance material;

placing the first encapsulating material layer with the metal particle layer on the first substrate;

disposing the plurality of solar cells on the metal particle layer;

precuring the plurality of solar cells, the metal particle layer, the first encapsulating material layer and the first substrate;

forming the routing layer on the plurality of solar cells such that the routing layer is disposed on only one side of the plurality of solar cells;

forming the second encapsulating material layer on the second substrate; and disposing and laminating the second substrate with the second encapsulating material layer on the routing layer, wherein the routing layer is covered by the second encapsulating material layer.

6. The method as claimed in claim 5, wherein the metal particle layer is composed of a plurality of metal particles, a particle diameter of the metal particles is between 20 nm and 150 nm.

7. The method as claimed in claim 5, wherein a coverage percentage of a light receiving surface of the plurality of solar cells covered by the metal particle layer is between 20% and 30%.

8. A method for manufacturing a solar cell encapsulating module as claimed in claim 1, comprising steps of:

forming the metal particle layer on the first encapsulating material layer;

providing the first substrate formed from the light transmittance material;

placing the first encapsulating material layer with the metal particle layer on the first substrate;

disposing the plurality of solar cells on the metal particle layer;

precuring the plurality of solar cells, the metal particle layer, the first encapsulating material layer and the first substrate;

forming the second encapsulating material layer on the second substrate;

forming the routing layer on the second encapsulating material layer; and disposing and laminating the second substrate with the second encapsulating material layer and the routing layer onto the plurality of solar cells, such that the routing layer is disposed on only one side of the plurality of solar cells, wherein the routing layer is in direct contact with the plurality of solar cells.

9. The method as claimed in claim 8, wherein the metal particle layer is composed of a plurality of metal particles, a particle diameter of the metal particles is between 20 nm and 150 nm.

10. The method as claimed in claim 8, wherein a coverage percentage of a light receiving surface of the plurality of solar cells covered by the metal particle layer is between 20% and 30%.

11. A method for manufacturing a solar cell encapsulating module as claimed in claim 1, comprising steps of:

forming the metal particle layer on the first encapsulating material layer;

providing the first substrate formed from the light transmittance material;

placing the first encapsulating material layer with the metal particle layer on the first substrate;

disposing the plurality of solar cells on the metal particle layer;

precuring the plurality of solar cells, the metal particle layer, the first encapsulating material layer and the first substrate;

forming the routing layer on the plurality of solar cells such that the routing layer is disposed on only one side of the plurality of solar cells;

forming the second encapsulating material layer on the routing layer; and disposing and laminating the second substrate onto the second encapsulating material layer.

12. The solar cell encapsulating module manufacturing method as claimed in claim 11, wherein the metal particle layer is composed of a plurality of metal particles, a particle diameter of the metal particles is between 20 nm and 150 nm.

13. The solar cell encapsulating module manufacturing method as claimed in claim 11, wherein a coverage percentage of a light receiving surface of the plurality of solar cells covered by the metal particle layer is between 20% and 30%.

* * * * *